US010488460B2

(12) United States Patent
Asaad et al.

(10) Patent No.: US 10,488,460 B2
(45) Date of Patent: Nov. 26, 2019

(54) CYCLE ACCURATE AND CYCLE REPRODUCIBLE MEMORY FOR AN FPGA BASED HARDWARE ACCELERATOR

(71) Applicant: International Business Machines Corporation, Armonk, NY (US)

(72) Inventors: Sameh W. Asaad, Briarcliff Manor, NY (US); Mohit Kapur, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 529 days.

(21) Appl. No.: 15/041,808

(22) Filed: Feb. 11, 2016

(65) Prior Publication Data

US 2016/0169970 A1    Jun. 16, 2016

Related U.S. Application Data

(63) Continuation of application No. 13/435,707, filed on Mar. 30, 2012, now Pat. No. 9,286,423.

(51) Int. Cl.
*G06F 17/50* (2006.01)
*G01R 31/317* (2006.01)
(Continued)

(52) U.S. Cl.
CPC ... *G01R 31/31703* (2013.01); *G01R 31/2851* (2013.01); *G01R 31/3177* (2013.01); *G01R 31/31727* (2013.01); *G06F 17/5027* (2013.01)

(58) Field of Classification Search
CPC .......... G01R 31/31703; G01R 31/3177; G01R 31/31727; G01R 31/2851; G06F 17/5027
(Continued)

(56) References Cited

U.S. PATENT DOCUMENTS 5,646,545 A   7/1997  Trimberger et al.
6,118,724 A   9/2000  Higginbottom
(Continued)

FOREIGN PATENT DOCUMENTS

CN     1828617 A      9/2006
CN   101093521 A     12/2007
(Continued)

OTHER PUBLICATIONS

Office Action, dated Dec. 13, 2017, received in a related U.S. Appl. No. 14/939,411.
(Continued)

*Primary Examiner* — Dwin M Craig
(74) *Attorney, Agent, or Firm* — Scully, Scott, Murphy & Presser, P.C.; Alvin Borromeo, Esq.

(57) ABSTRACT

A method, system and computer program product are disclosed for using a Field Programmable Gate Array (FPGA) to simulate operations of a device under test (DUT). The DUT includes a device memory having a number of input ports, and the FPGA is associated with a target memory having a second number of input ports, the second number being less than the first number. In one embodiment, a given set of inputs is applied to the device memory at a frequency Fd and in a defined cycle of time, and the given set of inputs is applied to the target memory at a frequency Ft. Ft is greater than Fd and cycle accuracy is maintained between the device memory and the target memory. In an embodiment, a cycle accurate model of the DUT memory is created by separating the DUT memory interface protocol from the target memory storage array.

26 Claims, 4 Drawing Sheets

(51) Int. Cl.
*G01R 31/28* (2006.01)
*G01R 31/3177* (2006.01)

(58) Field of Classification Search
USPC .......................................................... 703/13
See application file for complete search history.

(56) References Cited

U.S. PATENT DOCUMENTS

| | | | |
|---|---|---|---|
| 6,195,771 | B1 | 2/2001 | Tanabe et al. |
| 6,446,249 | B1 | 9/2002 | Wang et al. |
| 6,557,161 | B2 | 4/2003 | Jones |
| 6,993,469 | B1 | 1/2006 | Bortfeld |
| 7,269,805 | B1 | 9/2007 | Ansari et al. |
| 7,310,760 | B1 | 12/2007 | Sun et al. |
| 7,415,594 | B2 | 8/2008 | Doerr et al. |
| 7,587,697 | B1 | 9/2009 | Schmit et al. |
| 7,774,109 | B2 | 8/2010 | Nemecek |
| 7,774,190 | B1 | 8/2010 | Nemecek |
| 7,788,078 | B1* | 8/2010 | Braun ............... G06F 17/5022 703/14 |
| 7,930,162 | B1 | 4/2011 | Chan et al. |
| 8,058,905 | B1 | 11/2011 | Klein et al. |
| 8,067,948 | B2 | 11/2011 | Sequine |
| 8,145,469 | B2 | 3/2012 | Birguer |
| 8,595,683 | B1 | 11/2013 | De Buren et al. |
| 8,680,886 | B1 | 3/2014 | Atsatt |
| 2002/0073375 | A1 | 6/2002 | Hollander |
| 2002/0116168 | A1 | 8/2002 | Kim |
| 2003/0061341 | A1 | 3/2003 | Loh et al. |
| 2003/0074637 | A1 | 4/2003 | Pavesi et al. |
| 2003/0105607 | A1 | 6/2003 | Jones et al. |
| 2004/0078179 | A1 | 4/2004 | Fuji et al. |
| 2004/0254779 | A1 | 12/2004 | Wang et al. |
| 2004/0254906 | A1 | 12/2004 | Shei et al. |
| 2005/0131670 | A1 | 6/2005 | Wang et al. |
| 2005/0154577 | A1 | 7/2005 | Sakane et al. |
| 2005/0257109 | A1 | 11/2005 | Averbuj et al. |
| 2005/0276142 | A1 | 12/2005 | Pelley |
| 2006/0015313 | A1 | 1/2006 | Wang et al. |
| 2006/0117274 | A1 | 6/2006 | Tseng et al. |
| 2007/0129924 | A1 | 6/2007 | Verheyen et al. |
| 2007/0283183 | A1 | 12/2007 | Komoto |
| 2008/0136470 | A1 | 6/2008 | Moyal et al. |
| 2008/0288236 | A1 | 11/2008 | Schmitt et al. |
| 2008/0313578 | A1 | 12/2008 | Maixner et al. |
| 2009/0006894 | A1* | 1/2009 | Bellofatto ........... G06F 11/2236 714/34 |
| 2009/0083682 | A1 | 3/2009 | Akiba et al. |
| 2009/0113217 | A1* | 4/2009 | Dolgunov ........... G06F 12/1408 713/190 |
| 2009/0153212 | A1 | 6/2009 | Jeffries et al. |
| 2009/0158005 | A1* | 6/2009 | Carmichael ......... G06F 12/0862 711/213 |
| 2009/0271167 | A1 | 10/2009 | Zhu et al. |
| 2009/0319253 | A1 | 12/2009 | Phillips et al. |
| 2010/0005232 | A1 | 1/2010 | Randell et al. |
| 2010/0223502 | A1 | 9/2010 | Brunot et al. |
| 2011/0304352 | A1 | 12/2011 | Kwon et al. |
| 2012/0047412 | A1 | 2/2012 | Chung |
| 2012/0117413 | A1 | 5/2012 | Asaad et al. |
| 2012/0290993 | A1 | 11/2012 | Chene |
| 2013/0170525 | A1 | 7/2013 | Asaad et al. |
| 2013/0262072 | A1 | 10/2013 | Asaad et al. |

FOREIGN PATENT DOCUMENTS

| | | |
|---|---|---|
| CN | 102054056 A | 5/2011 |
| TW | 561411 | 11/2003 |
| TW | 200802011 | 1/2008 |
| WO | WO 2006/101836 A2 | 9/2006 |
| WO | WO 2008/014494 A2 | 1/2008 |

OTHER PUBLICATIONS

Hung et al., "SoC HW/SW Verification and Validation", 16th Asia and South Pacific Design Automation Conference, pp. 25-26, Jan. 2011.
Cofler et al., "A Reprogrammable EDGE Baseband and Multimedia Handset SoC With 6-Mbit Embedded DRAM", IEEE Journal of Solid-State Circuits, vol. 41, No. 1, Jan. 2006, pp. 97-106.
Micron Technology, Inc. "Various Methods of DRAM Refresh", TN-04-03, 1999, pp. 1-4.
Wong et al., "Intel Atom Processor Core Made FPGA-Synthesizable", FPGA'09, Feb. 22-24, 2009, pp. 209-218.
International Search Report and Written Opinion dated Jun. 14, 2013 issued in PCT/US2013/032903 filed Mar. 19, 2013.
International Search Report and Written Opinion dated Mar. 19, 2013 issued in PCT/US2013/020505.
Mavroidis et al., "Efficient Testbench Code Synthesis for a Hardware Emulator System", EDAA 2007.
Kumar, "designideas Readers Solve Design Problems: Compute a histogram in an FPGA with one clock", EDN, Feb. 3, 2011, pp. 43-49.
"Nios II Embedded Design Suite 6.0 Errata Sheet", ALTERA Corporation, ES-N2EDS6.0-1.1, Jun. 2006, pp. 1-17.
IEEE 100, "The Authoritative Dictionary of IEEE Standards Terms", Seventh Edition, 2000, p. 458.
Asaad et al., "A Cycle-accurate, Cycle-reproducible multi-FPGA System for Accelerating Multi-core Processor Simulation," FPGA'12, Feb. 22-24, 2012, Monterey, California.
Huang et al., "SoC HW/SW Verification and Validation", 2011 IEEE, Jan. 2011, Proceedings of the 16th Asia South Pacific Design Automation Conference, ASP-DAC 2011, Yokohama, Japan, Jan. 25-27, 2011, pp. 297-300.
Office Action, dated May 11, 2018, received in a related U.S. Patent Application, namely U.S. Appl. No. 14/939,411.

* cited by examiner

CYCLE ACCURATE AND CYCLE REPRODUCIBLE MEMORY FOR AN FPGA BASED HARDWARE ACCELERATOR

CROSS REFERENCE TO RELATED APPLICATION

This application is a continuation of U.S. patent application Ser. No. 13/435,707, filed Mar. 30, 2012, now U.S. Pat. No. 9,286,423, issued Mar. 15, 2016, the entire contents and disclosure of which are hereby incorporated herein by reference.

STATEMENT OF GOVERNMENT INTEREST

This invention was made with Government support under Contract No.: B554331 awarded by the Department of Energy (DOE). The Government has certain rights in this invention.

BACKGROUND OF THE INVENTION

The present invention generally relates to simulating the operation of integrated circuits, and more specifically, to using Field Programmable Gate Arrays to simulate the operation of integrated circuits.

As system on chip and multiple processor cores on a single chip are becoming a common practice, simulating these complex chips is becoming an expensive challenge. One of the techniques adopted in simulating these complex systems is Field Programmable Gate Array (FPGA) based hardware accelerators. These hardware accelerators work on the principle of dividing the chip design (device under test—DUT) into small blocks. These blocks are then implemented on various FPGAs. These FPGAs are inter-connected to each other in the same fashion as the original DUT design. The chip or DUT simulations can then be run on this specialized FPGA hardware instead of running them on a conventional simulator. Conventional simulators are completely written in software and run on a general purpose computer. Hardware simulators can give typically a speed advantage of several orders of magnitude over conventional simulators.

Accelerating the simulation may be desirable for a number of reasons. The number of simulations to be performed to validate a large digital chip is very large. To complete those simulations in a reasonable time using software, a large number of computers have to be employed, with the corresponding associated cost. An accelerated simulator reduces this number. Furthermore, it is often necessary to simulate a circuit for a very long time before getting to the point of interest. This long simulation is a sequential process that may take several days for a software implementation, and cannot be sped up by just using more computers.

One of several design challenges which arise in building hardware simulation accelerators is cycle accuracy. The FPGA based hardware accelerator should exactly match the behavior of the DUT on a cycle by cycle basis, which means—if the DUT were simulated on a software simulator or when the DUT is built into a single or multiple chips, at any given DUT clock cycle, all three systems—the hardware accelerator, the software simulator and the DUT chip—should be in the same state. This becomes a significant challenge in the design of hardware accelerators, as the DUT design may contain different kinds of memory—register arrays, SRAMs, embedded or external DRAMs. All of these DUT memory types have to be mapped into the FPGA on-chip memory or external memory connected to the FPGA.

Another design challenge in building hardware simulation accelerators is cycle reproducibility, which is defined as follows: multiple executions starting from the same initial condition shall yield identical trace for all DUT state. Every time that the simulation is performed with exactly the same stimulus, exactly the same results should be obtained by the simulator. In some instances, for example, the system might be running the simulation at different levels of optimization. At the highest level of optimization, the simulation runs very fast, and is used to check that nothing is wrong. If something is wrong, though, and the optimized simulation flags it, it is desirable to reproduce this simulation at a lower level of optimization that leaves a good trace for circuit debugging. The two simulations should behave exactly the same, or it would not be feasible to debug the circuit in this manner. Even though this cycle reproducibility property is usually easy to ensure in software implementations of the simulator, it becomes a significant issue when the software technique is replaced with a hardware accelerator technique. In one or more cases, this aspect is one of the more severe limitations on how much it is possible to speed-up the simulation of a digital circuit.

Cycle reproducibility is critical for enabling efficient debug of the simulation, and this requirement constrains how clocking and reset of the entire acceleration system is implemented. The requirement for cycle reproducibility also adds significant challenge in how the DUT memory is mapped onto the accelerator platform. Since the memory of the DUT constitutes a large portion of the system state, all addressable content of such memory needs to be properly initialized and maintained to match that of the software simulation and final chip implementation.

BRIEF SUMMARY

Embodiments of the invention provide a method, system and computer program product for using a Field Programmable Gate Array (FPGA) to simulate operations of a device under test (DUT). The DUT includes a device memory having a number of input ports, and the FPGA is associated with a target memory having a second number of input ports, the second number being less than the first number. In one embodiment, the method comprises applying a given set of inputs to the device memory via the input ports of the device memory at a frequency Fd and in a defined cycle of time, and applying the given set of inputs to the target memory via the input ports of the target memory at a frequency Ft. Ft is greater than Fd and all of the given set of inputs are applied to the target memory in the defined cycle of time to maintain cycle accuracy between the device memory and the target memory.

In an embodiment, the method further comprises creating a cycle accurate model of the DUT memory by separating the DUT memory interface protocol from the target memory storage array.

In one embodiment, the method further comprises creating a cycle accurate and cycle reproducible model of the DUT memory. This is done by operating a mapped DUT memory interface at a stoppable DUT clock, operating the target memory on a free running clock, and maintaining a constant frequency and phase relationship between the stoppable DUT clock and the free running clock.

In one embodiment, the device memory has a data width of Wd, and the target memory has a data width of Wt. The input ports of the device memory include one or more read ports and one or more write ports, and Nd is set equal to the larger of the number of the read ports or the number of the write ports of the device memory. At is a given number representing a defined number of Ft clock cycles consumed to perform a read or a write operation on the target memory; and Fd is less than or equal to (Ft)/(((Wd/Wt))(At+Nd)).

In an embodiment, the DUT memory is a DUT DRAM memory and the target memory is a target DRAM memory. The method further comprises hiding a refresh of the target DRAM memory by scrambling the addresses of the target DRAM memory to reduce the necessity for refreshing the target DRAM memory, forcing a refresh in the target DRAM memory when a refresh of the DUT DRAM memory occurs, and stopping a DUT clock while the refresh of the target memory is occurring, and restarting the DUT clock after the refresh of the target memory has finished.

In one embodiment, the DUT memory is a DUT DRAM memory the target memory is a target DRAM memory, and the target DRAM memory is refreshed at determined times. The method further comprises hiding the refresh of the target memory by hyper clocking the target memory so that the target memory and the DUT memory operate at different frequencies, and hiding the refresh of the target memory by using the frequency difference between the DUT memory operations and the target memory operations.

In an embodiment, command sequences are applied to the device memory, and the method further comprises using the target memory to detect and identify incorrect command sequences applied to the device memory.

In one embodiment, the method further comprises providing a programmable address translation between the device memory and the target memory for translating addresses in the device memory into addresses in the target memory, and using said programmable address translation to study performance optimization of the device memory.

In an embodiment, one or more device clocks are used to operate the device memory; and at defined times, the device memory is reset to a defined, non-zero device memory state. All of the one or more device clocks are stopped while resetting the device memory to the defined non-zero device memory state to provide the device memory with cycle reproducibility.

In an embodiment, a first, stoppable clock is used to operate the device memory at the frequency Fd, a second clock is used to operate the target memory at the frequency Ft, and the first, stoppable clock is stopped under defined conditions. The second clock is free-running when the first clock is stopped to apply at least some of the given set of inputs to the target memory while said first clock is stopped, and a constant phase relationship is maintained between the first and second clocks.

In embodiments of the invention, the target memory is hyper clocked, which means the memory is operated at a higher clock than the DUT clock, wherein the extra memory clock cycles are used to multiplex between ports of the target memory. As no extra DUT cycles are consumed to multiplex between read or write ports, the hyper clocked memory model maintains cycle accuracy.

To maintain cycle reproducible behavior, embodiments of the invention provide an initialization circuit that pre-loads a known state into memory using a multiplexed write port. The term pre-load is used to emphasize that no DUT clocks are running at this time. Initialization of the entire memory of a complex chip could involve several pre-loading circuits, and parts of the memory system can be selectively chosen for pre-load in order to preserve cycle reproducibility of the hardware accelerator.

DETAILED DESCRIPTION

Figure 1:
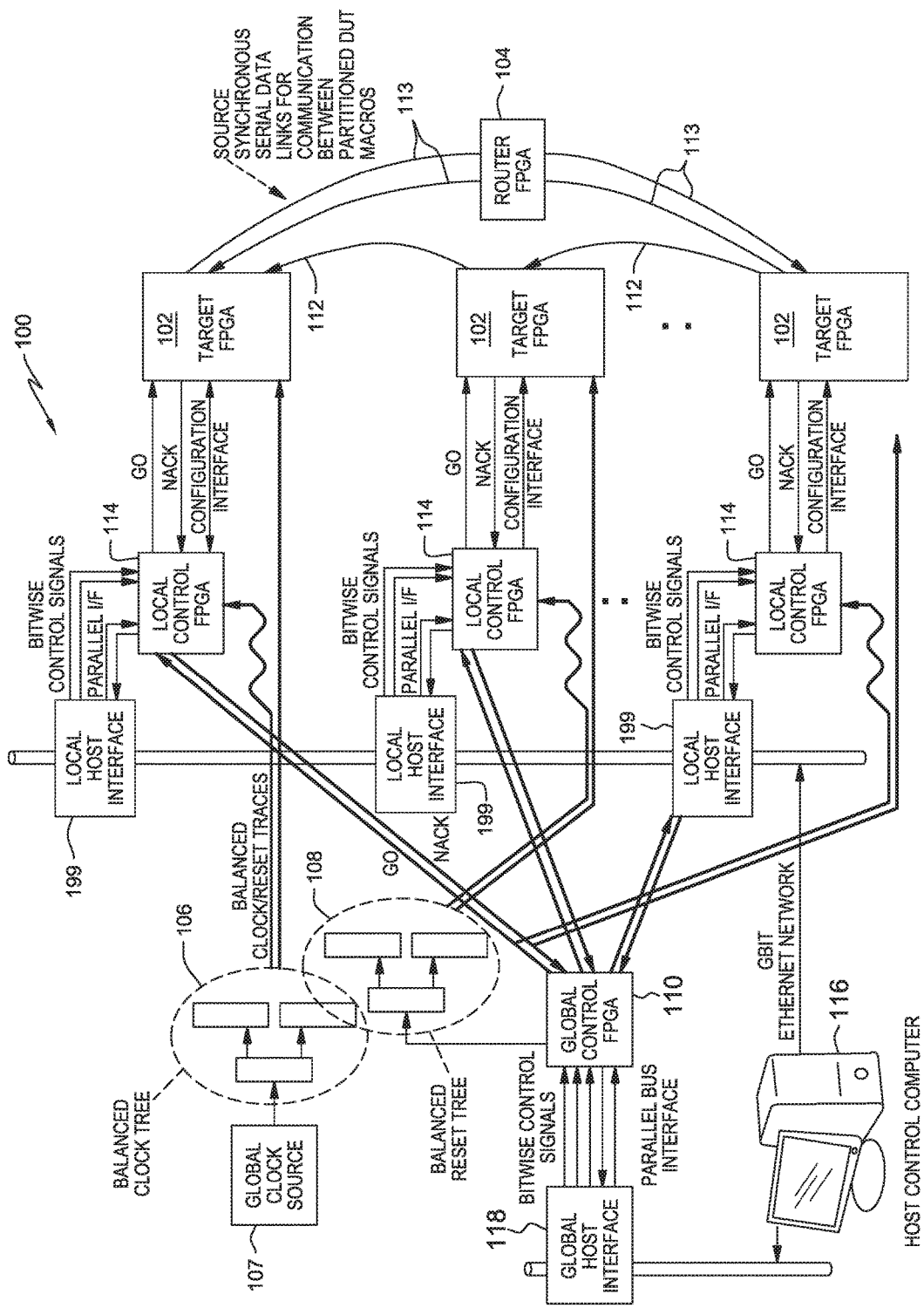
FIG. 1 shows a simulation system including a plurality of Field Programmable Gate Arrays (FPGA) devices in accordance with an embodiment of the invention.

As will be appreciated by one skilled in the art, embodiments of the present invention may be embodied as a system, method or computer program product. Accordingly, embodiments of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, embodiments of the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium, upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The present invention relates to the use of Field Programmable Gate Arrays (FPGAs) to simulate the operation of integrated circuits. More specifically, embodiments of the invention relate to maintaining a cycle accurate and cycle reproducible memory for a FPGA when the array is used to model an integrated circuit.

FPGAs are often used to simulate digital circuits. The VHDL and/or Verilog code (or other similar code) that describes the digital logic can be synthesized for an FPGA platform, and then run for a very large number of cycles to observe its behavior. Large digital circuits are typically much larger than that which can be simulated with a single FPGA, and the simulation of large digital circuits may require anywhere between 10 and 100 FPGAs. Furthermore, the simulation of a large digital circuit may require several types of operations, for example, to single step, create traces, or modify register values, or to carry out any one, some, or all of the other operations that are common in a modern simulation environment.

A simulator implemented using a large number of FPGAs typically requires that all of these FPGAs are coordinated in such a way that the different parts of the digital circuit under test are in lockstep, and remain in lockstep even when asynchronous simulation events might be occurring. A request for attention from one FPGA, for example, needs to propagate to all of the FPGAs in the simulator by the end of the current cycle, so that cycle-accurate information is preserved and can be scanned (or otherwise read) out of the simulator. This represents one manner in which assertion, print statements, and single stepping, among other features, can be implemented in the simulator.

A number of circuits and synchronization protocols may be implemented in an FPGA simulator infrastructure that allow a large number of FPGAs to synchronize on a cycle-by-cycle basis, allow for single stepping, allow any FPGA in the system to stop the simulation by the end of the current cycle, and/or guarantee cycle-reproducibility of the simulation independently of how it is being run.

The circuits used for synchronization can be classified into the following categories: high-speed clock, startup circuits, continuously running circuits, and circuits running only during simulation. Startup circuits create a global synchronous state at the beginning of the simulation. They include global reset synchronization, global clock synchronization, serial link bring-up, and the like. Continuously running circuits start running after the start-up circuits have finished initial synchronization, and keep running whether the simulation is advancing or not. These circuits include the serial links themselves, clock handshake sampling, simulation command processing, and the like. Circuits running only during simulation are active only while the simulation is active. They include all of the functional stoppable clocks, simulation counters, and the like.

With reference to FIG. 1, an exemplary system, according to an embodiment of the invention, includes a plurality of target field programmable gate arrays 102 interconnected in accordance with a connection topology and mapping portions of a target system, as well as a control module coupled to the plurality of target field programmable gate arrays. In a non-limiting example, the control module includes a host control computer 116 executing host control software, a global control field programmable gate array 110 coupled to the host control computer, and at least a first local control field programmable gate array 114 coupled to the global control field programmable gate array and at least a first portion of the plurality of target field programmable gate arrays 102.

In some cases, the system of FIG. 1 may further include a set of point-to-point free running serial communication links 112. The set of point-to-point free running serial communication links interconnect the plurality of target field programmable gate arrays 102 in accordance with the connection topology. In some embodiments, the connection topology mimics that of the target system. Some embodiments may include at least one router field programmable gate array 104 interconnecting at least a portion of the target field programmable gate arrays 102.

The global control field programmable gate array 110 is configured to initiate, stop, and single-step the simulation of the target system under control of the host control software. The at least first local control field programmable gate array 114 is configured to directly control the at least first portion of the plurality of target field programmable gate arrays and to forward system control commands from and to the global control field programmable gate array.

In some embodiments, there may be two or more local control field programmable gate arrays 114 coupled to the global control field programmable gate array 110 and each local control field programmable gate array may control one or more of the target field programmable gate arrays 102. In some embodiments, the global control field programmable gate array 110 may be further configured to receive and aggregate service request events from the local control field programmable gate arrays, and to stop simulation for service or error reporting events emanating from the plurality of target field programmable gate arrays. The local control field programmable gate arrays may also be responsible for direct control of corresponding portions (one or more) of the plurality of target field programmable gate arrays 102. In some embodiments, direct control of the corresponding portions of the plurality of target field programmable gate arrays by the local control field programmable gate arrays includes downloading target field programmable gate array configuration and memory image initialization.

Additional elements include a balanced clock distribution network 106 configured to distribute a reference clock signal 107, and a balanced reset distribution network 108 coupled to the control module and configured to distribute a reset signal to the plurality of target field programmable gate arrays. The control module and the balanced reset distribution network are cooperatively configured to initiate and control a simulation of the target system with the plurality of target field programmable gate arrays.

Figure 2:
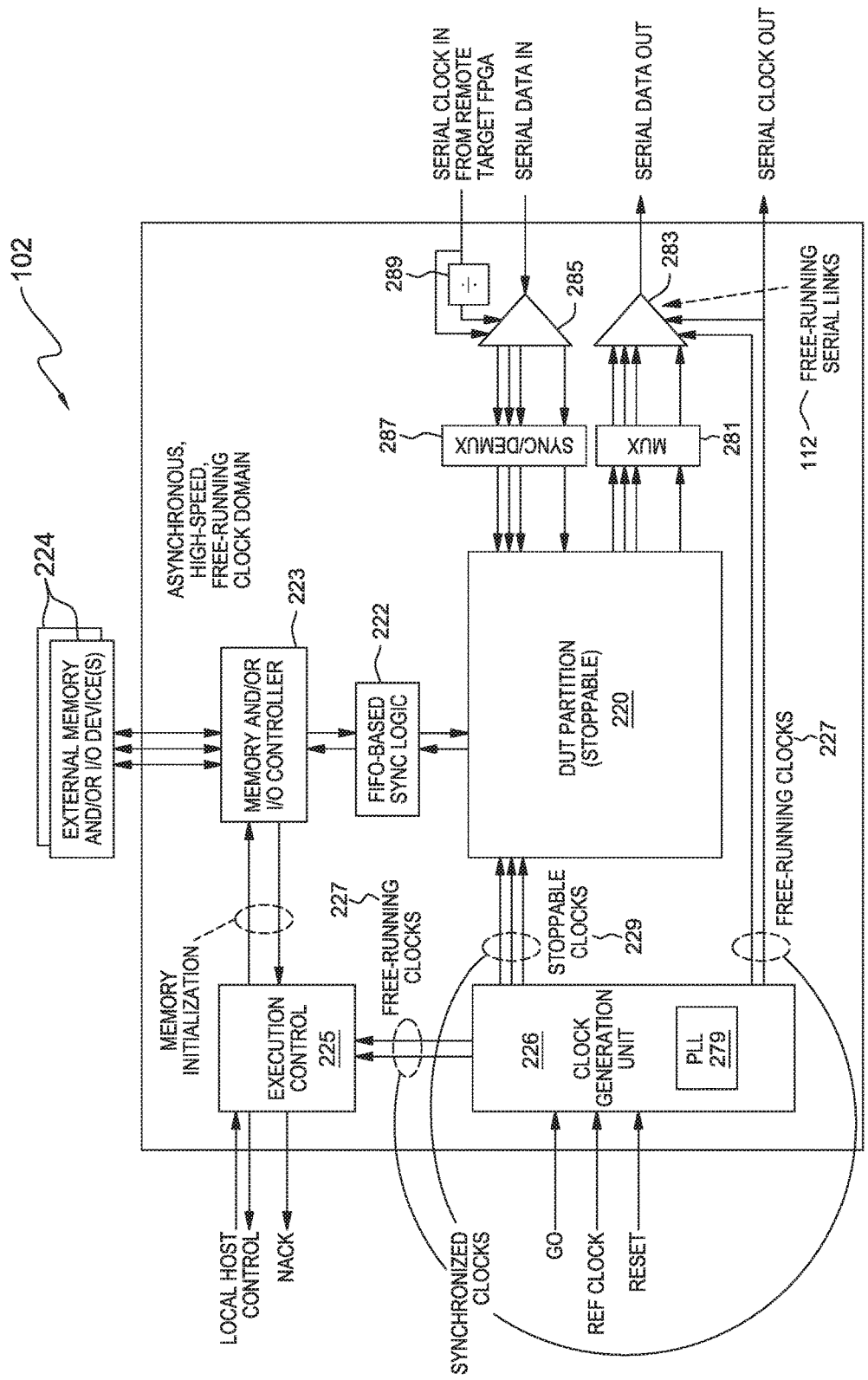
FIG. 2 depicts an exemplary architecture of a FPGA device.

With reference to FIGS. 1 and 2, a plurality of local clock control state machines 226 reside in the target field programmable gate arrays 102. The local clock control state machines are coupled to the balanced clock distribution network and obtain the reference clock signal therefrom. The plurality of local clock control state machines are configured to generate a set of synchronized free-running and stoppable clocks 227, 229 to maintain cycle-accurate and cycle-reproducible execution of the simulation of the target system.

In one or more embodiments, the balanced clock distribution network 106 distributes the reference clock signal 107 with a low skew. The balanced reset distribution network 108 distributes the reset signal with a low skew; the reset signal is, in one or more embodiments, a level-sensitive reset signal. As used herein, "low skew" is relative to the reference clock signal, such that the total skew of the balanced reset distribution network 108, from the earliest arriving to the latest arriving, is small relative to the cycle time of the reference clock signal, so that it can be guaranteed that it arrives everywhere in more or less the same reference clock cycle.

In some embodiments, the reference clock signal 107 is the highest clock frequency in the apparatus; and in other embodiments, the reference clock signal 107 is a reference to generate a highest clock frequency in the apparatus. In the latter instances, the plurality of target field programmable gate arrays 102 further include a plurality of phase-locked loops that generate the highest clock frequency from the reference. Some embodiments include at least one external memory device 224 accessible to the plurality of target field programmable gate arrays 102 and containing test code for conducting the simulation of the target system. Additional details of FPGA based hardware accelerators that may be used in embodiments of the invention are described in U.S. patent application Ser. No. 12/941,834, filed Nov. 8, 2010, for "Method And Infrastructure For Cycle-Reproducible Simulation On Large Scale Digital Circuits On A Coordinated Set Of FPGAs," the disclosure of which is hereby incorporated herein by reference in its entirety.

In an embodiment of the operation of simulation system 100, short snapshots are collected at regular intervals to identify a period where a fault originates, and then a more complete waveform trace is obtained in the identified period where the fault occurs, via a simulation replay at a finer granularity. For example, instead of taking a complete trace of the simulation, which takes a long time, a snapshot may be taken every predetermined number of cycles (e.g., several thousand), and the first snapshot where the fault occurs may be found. A complete trace may be conducted (cycle-by-cycle snapshots) between the last snapshot before the fault was observed and the first snapshot where the fault was noted.

In order to achieve this simulation, it is important to achieve both cycle accuracy and cycle reproducibility. This is a significant challenge in the design of hardware accelerators because, in significant part, the DUT may contain different kinds of memory—register arrays, SRAMS, embedded or external DRAMs.

Memory in present day chips, exists in several forms based upon capacity, access time and power consumption. Chip designers use register arrays for very fast and small size storage, typically of the order of a few Kilo Bytes. Register arrays or register files are a few thousand compactly arranged registers. Other basic forms of memory are the static random access memory (SRAM) and dynamic random access memory (DRAM). SRAMs are faster than DRAMs but larger in area and power consumption and therefore are used in capacities of a few mega bytes. DRAMs are preferred higher densities and generally cover the large mega byte to several giga bytes space. In a hardware accelerator these memories could be mapped into any form of memory available either on FPGA or outside FPGA.

Cycle Accuracy

Consider the problem of cycle accuracy in mapping DUT memory to an FPGA based hardware accelerator memory. This hardware accelerator memory is referred to as target memory.

As stated earlier, DUT memory in the form of register files or SRAMs can have multiple read/write ports. The memory present on the FPGA, the target memory, has usually a single read and a single write port. In order to model a multi port memory using a single port memory, a simple time division multiplexing technique can be used. In this technique, all parallel events are serialized using some arbitration technique. This technique is not sufficient to maintain cycle accuracy of the mapped memory model. In embodiments of the invention, the target memory is hyper clocked, which means the memory is operated at a higher clock rate than the DUT clock, wherein the extra memory clock cycles are used to multiplex between ports. As no extra DUT cycles are consumed to multiplex between multiple read or write ports, the hyper clocked memory model maintains cycle accuracy.

This technique can also be used to perform data port width matching between the DUT and the target memory. For example, let the DUT memory to be modeled be a level two cache of a microprocessor. The cache line in present day microprocessors can be as wide as 128 bytes or more. Depending upon the size of the cache, one may wish to model it using an external SRAM attached to the FPGA. In order to save pins on the FPGA, embodiments of the invention use a smaller width external SRAM and use the same hyper clocking technique to perform the multiple reads or writes necessary to construct the DUT memory data width. In the present example, if one decides to use an eight bit external SRAM to model the L2 cache, one would have to perform 128 read or write operations to mimic the behavior of a single read or write of the DUT cache. To preserve cycle accuracy between the DUT and target memory models, all the 128 read or write operations must finish in less than one DUT clock cycle.

The DUT memory itself may take more than a single cycle to complete a read or write, so the previous restriction can be relaxed. This relaxation will yield a higher performance system at the cost of simplicity. The read or write latencies can vary a lot based upon the history of operations, thus making it complex to keep track of the worst case number, so it is easier to complete the target memory operations in less than a single DUT cycle and then present the result only when the desired latency is achieved.

To generalize this technique, let the maximum frequency at which a target memory can be operated be Ft. Let the DUT memory to be mapped have Nd read or write ports, which ever is bigger.

$$Nd>1 \qquad (1)$$

Let the target memory have a single read and a single write port. Let the data width of the DUT memory be Wd and that of target memory be Wt.

$$Wd>=Wt \qquad (2)$$

In the case when Wt>Wd, the extra bits in the target memory can be left unused.

Let At be the worst case number of Ft clock cycles consumed to perform a read or a write operation on the target memory. To maintain cycle accuracy the DUT clock (with frequency Fd) and the target memory clock (with frequency Ft) must obey the following equation:

$$Fd<=Ft/((Wd/Wt)*(At+Nd)) \qquad (3)$$

Equation 3 assumes that the target memory has a pipelined architecture. Additional details that may be used in embodiments of the invention for generating clock signals are described in copending application Ser. No. 13/435,614, filed herewith now U.S. Pat. No. 9,230,046, issued Jan. 5, 2016, for "Generating Clock Signals For a Cycle Accurate, Cycle Reproducible FPGA Based Hardware Accelerator," the disclosure of which is hereby incorporated herein by reference in its entirety.

Another form of DUT memory which requires special handling while porting to a target FPGA memory is DRAM. The DUT may use an embedded DRAM or a separate DRAM chip for storage. In both cases, one can either use an SRAM or a DRAM as target memory to model the DUT DRAM.

Figure 4:
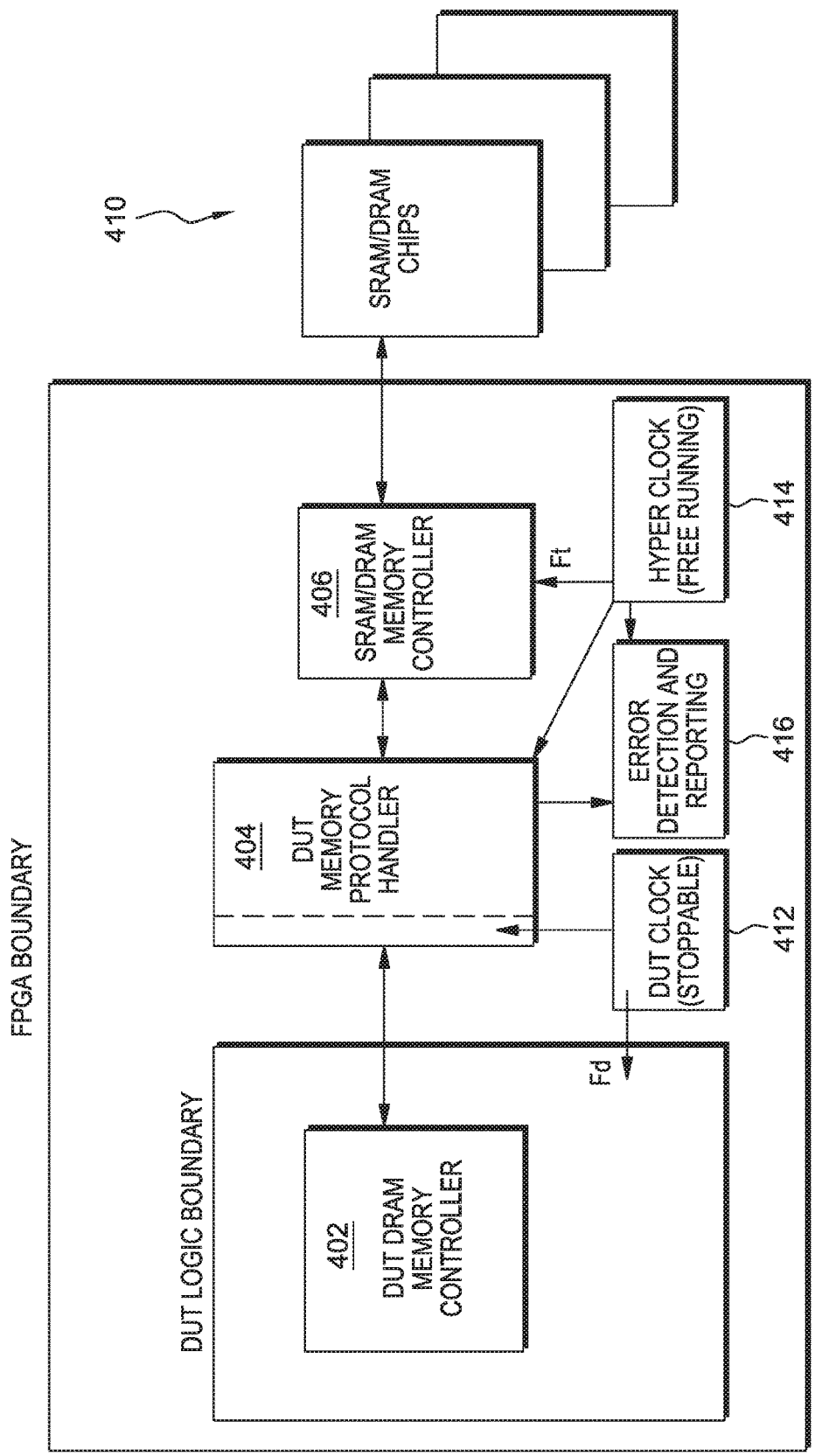
FIG. 4 shows a block diagram of a target memory model implementing a Device Under Test DRAM in accordance with an embodiment of the invention.

FIG. 4 shows a block diagram of a target memory model implementing a DUT DRAM. The block diagram of FIG. 4 shows a DUT DRAM controller 402 which is mapped to FPGA logic. Command and data being sent and received from this controller are interpreted by the protocol handler and data parser block 404. This block 404 would receive DRAM commands like read, write, refresh, precharge, activate etc and translate them into equivalent ones for the memory controller 406 of target memory 410. The target memory controller 406 will then take these translated commands and drive the off-chip target memory. This memory could exist in the form of a SRAM or DRAM.

In this embodiment, this technique separates the DUT memory interface protocol from the memory capacity. The former is implemented in the FPGA logic (using DUT Memory Protocol Handler 404 and Error Detection and Reporting block 416) and the latter can be modeled using any memory subsystem (target memory 410) available on the hardware accelerator board. This way, the DUT memory controller 402 like the rest of DUT logic will be operated at frequency Fd, whereas the protocol handler 404, the target memory controller 406 and the target memory array 410 will be operated at frequency Ft as derived in equation (3).

Separating the DUT memory interface protocol from memory capacity and running the former at DUT clock rate Fd and the latter at hyper clock rate Ft offers another advantage—The Fd clock generator 412 can be made stoppable whereas the Ft clock generator 414 can be left free running. Both the stoppable as well as free running clocks should have a constant phase relationship to maintain cycle reproducibility. To have the DUT clock stoppable allows features like single stepping the hardware accelerator. Operating the target memory using a free running clock allows the use of a DRAM for target memory.

Figure 3:
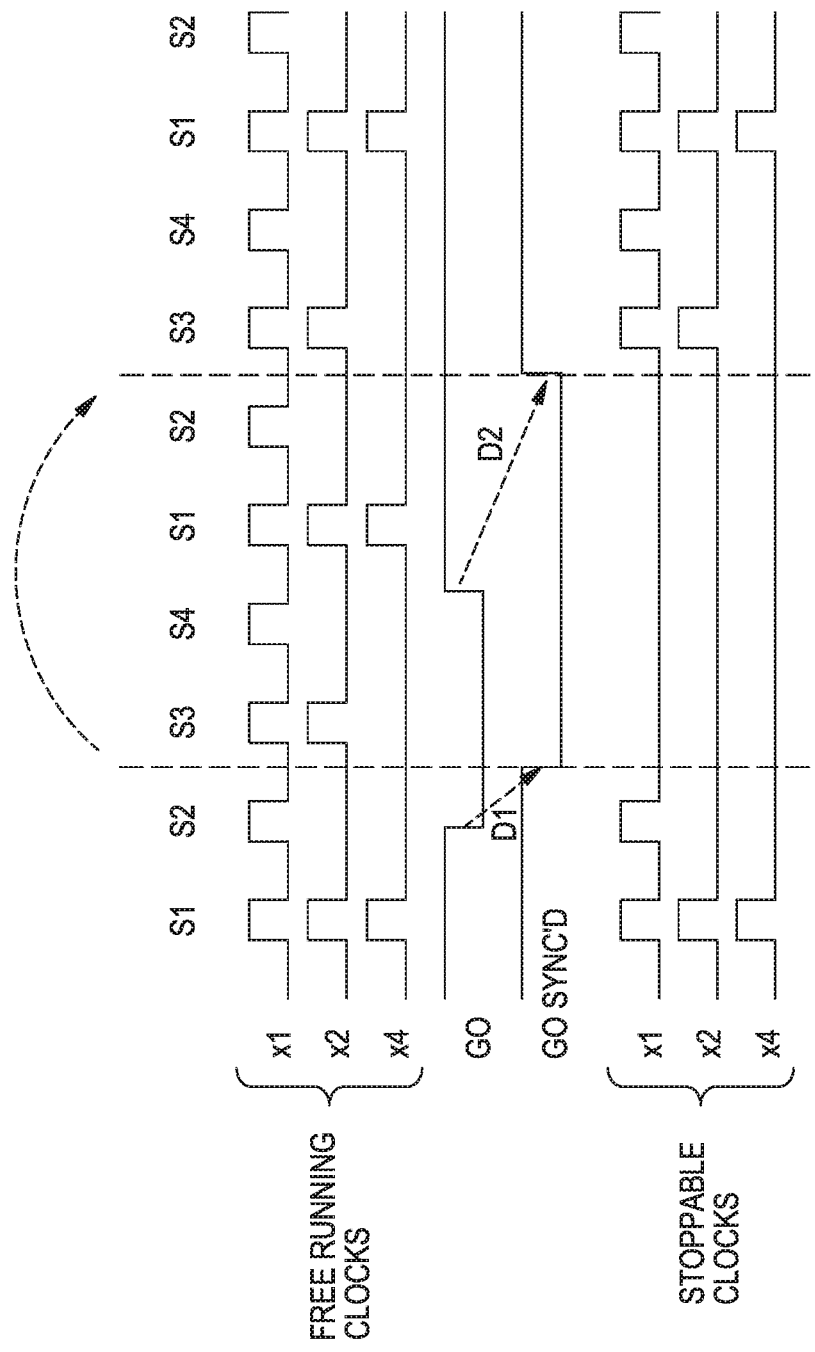
FIG. 3 illustrates the operation of free-running and stoppable clocks.

FIG. 3 shows synchronizing free-running clock signals with stoppable clock signals. As seen therein, clock phases are generated using asynchronous state machine controller 226 so they all run in lockstep (simplified version with four states S1, S2, S3, S4 shown for clarity). In one or more instances, state machine controller 226 is quite flexible, enabling the generation of any rational set of clock frequencies while maintaining phase. In at least some cases, the "go" signal from the global controller 110 can be asserted and/or de-asserted at any time to start and/or stop the execution of the simulation. As seen at D1 in FIG. 3, internal to the clock controller, the de-assertion of the go signal is delayed to the first inactive portion (low) of the clock, avoiding potential clock pulse glitches. Furthermore, as also seen in FIG. 3, the rising edge of the go signal is delayed by D2 to allow the stoppable clocks to resume at the correct state. In this figure, clocks stopped after S2 and can only be resumed to continue with S3. Derived clocks with lower frequencies (e.g. x2, x4 (as compared to x1)) are produced by dropping pulses, rather than keeping a 50% duty cycle. The advantage of this scheme is to guarantee time periods when all clocks are inactive (low), which serve as opportune windows in time to start and/or stop the clock state machine in a glitch-free manner.

The DUT memory protocol handler in the embodiment of FIG. 4 should handle the following functions:
1. Interpret DUT memory protocol;
2. Error detection and reporting;
3. Address translation between DUT and target memories;
4. Data width matching between DUT and target memories;
5. Refresh compensation; and
6. Support for architectural exploration of various DUT memory configurations.

In addition to modeling the DUT memory protocol itself in FPGA logic, embodiments of the invention provide extra checking logic to monitor proper adherence to the protocol by the rest of the DUT logic, thus providing valuable verification coverage. For example, test circuits can be inserted to check for proper timing of a write after read operation to the same memory location and report any violations.

The DRAMs need to be refreshed periodically in order to maintain their contents. This refresh should be accurately modeled in the target memory. If the target memory is an SRAM, then the refresh can be modeled by stopping the SRAM clocks for the refresh period, thus making it unavailable for any other operations. Embodiments of the invention model a detector 416 which will raise an error flag, if a read or write command is generated by the DUT logic during the refresh period.

If the target memory is modeled using a DRAM, then one has to handle two separate refreshes because both the DUT as well as the target memory will have their own refresh rates. The target memory will usually be hyper clocked to compensate for width and depth mismatches as illustrated in equation (3), and therefore the refresh for DUT DRAM will not overlap the refresh for target DRAM. Additionally, the target DRAM refresh period should always be invisible to DUT logic, or else the target memory model will lose cycle accuracy. To solve this problem, embodiments of the invention provide two approaches.

One approach is to minimize the refresh required in the target memory by address scrambling. In DRAMs, the linear address is divided into row, column, bank and rank addresses. If one assigns low order bits of the linear address to rank and bank address, different banks will be addressed more often, thus reducing the necessity for refresh. These low order address bits can further be randomized using a known pseudo random binary sequence, thus ensuring variation in the bits. In addition to address scrambling, at the times when DUT memory requires a refresh, one can force a refresh in target memory. Both the techniques—address scrambling and forced refresh—take place at hyper clocked rate and thus are invisible to DUT clock cycle, thus maintaining cycle accuracy. In the rare event when the target memory does require a refresh, embodiments of the invention stop the DUT clocks for the duration of refresh and restart them when the refresh is over. The DUT clocks will not progress during the target memory refresh period, therefore there is no state change in the DUT, thus the cycle accuracy of the entire system is maintained. This technique gives the highest performance with the drawback of higher complexity.

The second approach to the above-problem provides a simpler solution with reduced or minimal cost to performance. Let Rc be the number of cycles required to perform the target memory refresh. Then equation (3) scales to:

$$Fd<=Ft/((Wd/Wt)*(At+Rc+Nd)) \quad (4)$$

Thus the target refresh period is always accounted for when computing the allowable DUT frequency of operation.

DRAMs have a large command set compared to SRAMs. Not all the commands required to operate a DRAM have a functional equivalent in SRAMs. For example, a bank activate command can not be explicitly modeled in an SRAM target memory. To handle this command, the protocol handler in the block diagram of FIG. 4 detects this command and uses it to extract the row address of the bank being activated. This row address is then used to form the linear address for the SRAM being used as a target memory. If the target memory is also a DRAM, the row address extracted can then be used to generate the address for the target DRAM. Similarly, a mode set register command should be interpreted to extract read and write latencies. These latencies can then be used to present the command results at the desired time to the DUT logic. In this way, cycle accuracy is maintained.

Cycle Reproducibility

For a hardware accelerator to demonstrate the property of cycle reproducible behavior, memory in any form must start at the same state after reset. Embodiments of the invention provide an initialization circuit to achieve this cycle reproducible behavior. The circuit pre-loads a known state into memory using a multiplexed write port. One can find simple analog circuits, which will initialize all memory contents to zero, but they are not useful when the data needs to be stored with error correction code or parity. FPGA vendors propose including a binary file during configuration to initialize all the memory contents to a known state. Although this technique is superior in terms of resource utilization, it is not flexible. The term pre-load in the technique disclosed herein is used to emphasize that no DUT clocks should be running at this time. Initialization of the entire memory of a complex chip could involve several pre-loading circuits, although it may not be required to pre-load the entire memory state. For example, in a microprocessor, one may need to pre-load only the boot memory and the main memory for the entire memory model to be cycle reproducible. Thus, one can selectively choose parts of the memory system for pre-load in order to preserve cycle reproducibility of the hardware accelerator.

Memory is usually the most expensive resource in any computer system. Although the primary purpose of simulation accelerators is to model the DUT memory in a cycle accurate and cycle reproducible manner, one could also use it for memory density computation of a system, where memory density computation refers to populating the DUT with the right number of DRAM memory chips to achieve maximum performance. The DRAM addressing space is divided into row, column, bank and rank addresses. For a specific application, it may be desirable to have more ranks and smaller banks for the same total memory in order to give higher performance. Having a prior knowledge of this data can greatly reduce the cost of the system. It can be also used to build highly application optimized systems. To achieve this level of optimization, embodiments of the invention provide a programmable address translation from DUT DRAM address space to target memory address space. This programmability works like a switch panel, where any address bit from one side can be connected to any other address bit on the other side. Since the latencies for all operations are accurately modeled and there is a one to one correspondence between every memory location, the application can be run in several different configurations to study the performance impact.

The description of the present invention has been presented for purposes of illustration and description, but is not intended to be exhaustive or to limit the invention in the form disclosed. Many modifications and variations will be apparent to those of ordinary skill in the art without departing from the scope of the invention. The embodiments were chosen and described in order to best explain the principles of the invention and the practical application, and to enable others of ordinary skill in the art to understand the invention for various embodiments with various modifications as are suited to the particular use contemplated.

The invention claimed is:

1. A method of using a Field Programmable Gate Array (FPGA) to simulate operations of an integrated circuit device under test (DUT) to validate the DUT, and to maintain a cycle accurate memory for the FPGA, the DUT including a device memory having a first number of input ports and operating in device clock cycles at a frequency Fd, the FPGA being associated with a target memory having a second number of input ports, and operating in target clock cycles at a frequency Ft, said second number being less than said first number, and Ft being greater than Fd, the method comprising:

in a defined cycle of time, applying a given set of inputs to the device memory via the input ports of the device memory;

simulating operation of the DUT by, in said defined cycle of time, applying the given set of inputs to the target memory via the input ports of the target memory to simulate operation of the DUT, wherein in said defined cycle of time, the target memory has more target clock cycles than the device memory has device clock cycles, and at an end of said defined cycle of time, each of the device memory and the target memory has an associated state; including using said more target clock cycles of the target memory for multiplexing the given set of inputs to the target memory in said defined cycle of time; and initiating and controlling the simulation of the DUT with the FPGA by using a control module for applying to the FPGA control signals to maintain cycle accuracy between the device memory and the target memory, wherein at the end of said defined cycle of time, the device memory and the target memory are in the same state to validate the DUT over the defined cycle of time.

2. The method according to claim 1, further comprising:
generating a set of synchronized free-running clock signals and stoppable clock signals; and
using the stoppable clock signals to operate the device memory at the frequency Fd and using the free-running clock signals to operate the target memory at the frequency Ft to maintain cycle-accurate and cycle-reproducible execution of the simulation of the device memory by the FPGA.

3. The method according to claim 1, further comprising creating a cycle accurate and cycle reproducible model of the DUT memory by operating a mapped DUT memory interface at a stoppable DUT clock, and operating the target memory on a free running clock; and wherein the stoppable DUT clock and the free running clock have a constant frequency and phase relationship.

4. The method according to claim 1, wherein:
the device memory has a data width of Wd, and the target memory has a data width of Wt;
the input ports of the device memory include one or more read ports and one or more write ports;
Fd is less than or equal to (Ft)/((Wd/Wt))(At+Nd)), wherein:
Nd is set equal to the larger of the number of the read ports or the number of the write ports of the device memory, and
At is a given number representing a defined number of Ft clock cycles consumed to perform a read or a write operation of the target memory.

5. The method according to claim 1, wherein the DUT memory is a DUT DRAM memory and the target memory is a target DRAM memory, and the method further comprising:
hiding a refresh of the target DRAM memory by
scrambling the addresses of the target DRAM memory to reduce the necessity for refreshing the target DRAM memory,
forcing a refresh in the target DRAM memory when a refresh of the DUT DRAM memory occurs, and
stopping a DUT clock while the refresh of the target memory is occurring, and restarting the DUT clock after the refresh of the target memory has finished.

6. The method according to claim 1, wherein command sequences are applied to the device memory, and the method further comprises:
using the target memory to detect and identify incorrect command sequences applied to the device memory.

7. The method according to claim 1, further comprising:
providing a programmable address translation between the device memory and the target memory for translating addresses in the device memory into addresses in the target memory; and
using said programmable address translation to study performance optimization of the device memory.

8. The method according to claim 1, further comprising:
using one or more device clocks to operate the device memory;
at defined times, resetting the device memory to a defined, non-zero device memory state; and
stopping all of the one or more device clocks while resetting the device memory to the defined non-zero device memory state to provide the device memory with cycle reproducibility.

9. The method according to claim 1, wherein the applying a given set of inputs to the device memory includes:
using a first, stoppable clock to operate the device memory at the frequency Fd; and
using a second clock to operate the target memory at the frequency Ft;
under defined conditions, stopping said first, stoppable clock;
free-running said second clock when said first clock is stopped to apply at least some of the given set of inputs to the target memory while said first clock is stopped; and
maintaining a constant phase relationship between the first and second clocks.

10. The method according to claim 1, wherein at the end of said defined cycle of time, the device memory and the target memory are in the same state, therein indicating no fault originated in the device memory over said defined cycle of time.

11. A method of using a Field Programmable Gate Array (FPGA) to simulate operations of an integrated circuit device under test (DUT) to validate the DUT, and to maintain a cycle accurate memory for the FPGA, the DUT including a device memory having a number of input ports, the FPGA being associated with a target memory having a second number of input ports, said second number being less than said first number, the method comprising:
applying a given set of inputs to the device memory via the input ports of the device memory at a frequency Fd and in a defined cycle of time;
simulating operation of the DUT by, in the defined cycle of time, applying said given set of inputs to the target memory via the input ports of the target memory at a frequency Ft to simulate
operation of the DUT, wherein Ft is greater than Fd, to apply all of said given set of inputs to the target memory in said defined cycle of time; and
initiating and controlling the simulation of the DUT with the FPGA by using a control module for applying to the FPGA control signals to initiate and control the simulation of the DUT with the FPGA and to maintain cycle accuracy between the device memory and the target memory,
wherein the DUT memory is a DUT DRAM memory and the target memory is a target DRAM memory, and the target DRAM memory is refreshed at determined times, and
wherein the applying to the FPGA control signals includes applying the control signals to the FPGA for hiding the refresh of the target memory by hyper clocking the target memory so that the target memory and the DUT memory operate at different frequencies, and hiding the refresh of the target memory by using the frequency difference between the DUT memory operations and the target memory operations.

12. A system for simulating operations of an integrated circuit device under test (DUT) to validate the DUT, and to maintain a cycle accurate memory for the FPGA,
the DUT including a device memory having a first number of input ports and operating in device clock cycles at a frequency Fd, the system comprising:
at least one Field Programmable Gate Array (FPGA);
a target memory communicatively associated with the FPGA, the target memory having a second number of input ports, and operating in target clock cycles at a frequency Ft, said second number being less than said first number, and Ft being greater than Fd;
a controller for applying in a defined cycle of time, a given set of inputs to the device memory via the input ports of the device memory, for simulating operation of the DUT by, in the defined cycle of time, applying the given set of inputs to the target memory via the input ports of the target memory to simulate operation of the DUT, wherein in said defined cycle of time, the target memory has more target clock cycles than the device memory has device clock cycles, and at an end of said defined cycle of time, each of the device memory and the target memory has an associated state;
said simulating operation of the DUT including
using said more target clock cycles of the target memory for multiplexing the given set of inputs to the target memory in said defined cycle of time, and initiating and controlling the simulation of the DUT with the FPGA by applying to the FPGA control signals to maintain cycle accuracy between the device memory and the target memory, wherein at the end of said defined cycle of time, the device memory and the target memory are in the same state to validate the DUT over the defined cycle of time.

13. The system according to claim 12, wherein:
the target memory controller creates a cycle accurate model of the DUT memory by separating a DUT memory interface protocol from a target memory storage array.

14. The system according to claim 12, wherein:
a stoppable DUT clock is used to operate a mapped DUT memory interface: and
the target memory controller creates a cycle accurate and cycle reproducible model of the DUT memory by operating the target memory on a free running clock, while the DUT memory interface is operated at the stoppable DUT clock; and wherein the stoppable DUT clock and the free running clock have a constant frequency and phase relationship.

15. The system according to claim 12, wherein:
the DUT memory is a DUT DRAM memory and the target memory is a target DRAM memory; and
the target memory controller hides a refresh of the target DRAM memory by scrambling the addresses of the target DRAM memory to reduce the necessity for refreshing the target DRAM memory,
forcing a refresh in the target DRAM memory when a refresh of the DUT DRAM memory occurs, and
stopping a DUT clock while the refresh of the target memory is occurring, and restarting the DUT clock after the refresh of the target memory has finished.

16. The system according to claim 12, wherein:
the DUT memory is a DUT DRAM memory and the target memory is a target DRAM memory, and the target DRAM memory is refreshed at determined times; and
the target memory controller hides the refresh of the target memory by hyper clocking the target memory so that the target memory and the DUT memory operate at different frequencies, and hiding the refresh of the target memory by using the frequency difference between the DUT memory operations and the target memory operations.

17. An article of manufacture comprising:
at least one non-transitory computer readable hardware device having computer readable program code logic tangibly embodied therein to simulate operations of an integrated circuit device under test (DUT) to validate the DUT using a Field Programmable Gate Array (FPGA), and to maintain a cycle accurate memory for the FPGA, the DUT including a device memory having a first number of input ports and operating in device clock cycles at a frequency Fd, the FPGA being associated with a target memory having a second number of input ports and operating in target clock signals at a frequency Ft, said second number being less than said first number, and Ft being greater than Fd, the computer readable program code logic, when executing, performing the following:
in a defined cycle of time, applying a given set of inputs to the device memory via the input ports of the device memory,
simulating operation of the DUT by, in the defined cycle of time, applying the given set of inputs to the target memory via the input ports of the target memory to simulate operation of the DUT, wherein in said defined cycle of time, the target memory has more target clock cycles than the device memory has device clock cycles, and at an end of said defined cycle of time, each of the device memory and the target memory has an associated state; including
using said more target clock cycles of the target memory for multiplexing the given set of inputs to the target memory in said defined cycle of time; and initiating and controlling the simulation of the DUT with the FPGA by applying to the FPGA control signals to maintain cycle accuracy between the device memory and the target memory, wherein at the end of said defined cycle of time, the device memory and the target memory are in the same state to validate the DUT over the defined cycle of time.

18. The article of manufacture according to claim 17, wherein the computer readable program code logic, when executing, further performs:
creating a cycle accurate model of the DUT memory by separating the DUT memory interface protocol from the target memory storage array.

19. The article of manufacture according to claim 18, wherein the computer readable program code logic, when executing, further performs:
creating a cycle accurate and cycle reproducible model of the DUT memory by operating a mapped DUT memory interface at a stoppable DUT clock, and operating the target memory on a free running clock; and wherein the stoppable DUT clock and the free running clock have a constant frequency and phase relationship.

20. A method of modeling cycle accurate and cycle reproducible memory for a Field Programmable Gate Array (FPGA) based hardware accelerator, the method comprising:
in a defined cycle of time, applying a given set of inputs to a memory of an integrated circuit device under test (DUT) to validate the DUT, and to maintain a cycle accurate memory for the FPGA, the DUT operating in device clock cycles at a frequency Fd, the memory of the DUT having a first number of input ports, simulating operation of the DUT by, in the defined cycle of time, applying the given set of inputs to a target memory operating in target clock cycles at a frequency Ft to simulate operation of the DUT, said target memory having a second number of input ports, said second number being less than said first number, and Ft being greater than Fd, wherein in said defined cycle of time, the target memory has more target clock cycles than the device memory has device clock cycles, and at an end of said defined cycle of time, each of the device memory and the target memory has an associated state; including using said more target memory clock cycles of the target memory for multiplexing the given set of inputs to the target memory in said defined cycle of time; and initiating and controlling the simulation of the DUT with the FPGA by applying to the FPGA control signals to maintain cycle accuracy between the device memory and the target memory, wherein at the end of said defined cycle of time, the device memory and the target memory are in the same state to validate the DUT over the defined cycle of time;

creating a cycle accurate model of the DUT memory by separating a DUT memory interface protocol from a target memory storage array, including using one or more first, stoppable device memory clocks to operate the device memory at the frequency Fd;

using one or more target memory clocks to operate the target memory at the frequency Ft;

at defined times, resetting the device memory to a defined, non-zero device memory state; and stopping the one or more device memory clocks while resetting the device memory to the defined non-zero device memory state to provide the device memory with cycle reproducibility.

21. The method according to claim 20, further comprising creating a cycle accurate and cycle reproducible model of the DUT memory by operating a mapped DUT memory interface at a stoppable DUT clock, and operating the target memory on a free running clock;

and wherein the stoppable DUT clock and the free running clock have a constant frequency and phase relationship.

22. The method according to claim 20, wherein the DUT memory is a DUT DRAM memory and the target memory is a target DRAM memory, and the method further comprising:

hiding a refresh of the target DRAM memory by scrambling the addresses of the target DRAM memory to reduce the necessity for refreshing the target DRAM memory, forcing a refresh in the target DRAM memory when a refresh of the DUT DRAM memory occurs, and stopping a DUT clock while the refresh of the target memory is occurring, and restarting the DUT clock after the refresh of the target memory has finished.

23. The method according to claim 20, wherein the DUT memory is a DUT DRAM memory and the target memory is a target DRAM memory, and the target DRAM memory is refreshed at determined times, and the method further comprising:

hiding the refresh of the target memory by hyper clocking the target memory so that the target memory and the DUT memory operate at different frequencies, and hiding the refresh of the target memory by using the frequency difference between the DUT memory operations and the target memory operations.

24. A system to model cycle accurate and cycle reproducible memory for a Field Programmable Gate Array (FPGA) based hardware accelerator device, the system comprising:

at least one Field Programmable Gate Array (FPGA);

a DUT controller for applying, in a defined cycle of time, a given set of inputs to a memory of an integrated circuit device under test (DUT) to validate the DUT, the DUT operating in device clock cycles at a frequency Fd, the DUT having a first number of input ports;

a target memory communicatively associated with the FPGA, the target memory having a second number of input ports, and operating in target clock cycles at a frequency Ft, said second number being less than said first number, and Ft being greater than Fd;

one or more, stoppable device memory clocks to operate the memory of the DUT at a frequency Fd;

one or more target memory clocks to operate the target memory at the frequency Ft;

the DUT controller is configured for stopping the one or more device memory clocks under defined conditions, for resetting the device memory at defined times to a defined, non-zero device memory state, and for stopping the one or more device memory clocks while resetting the device memory to the defined non-zero device memory state to provide the device memory with cycle reproducibility;

a target memory controller for simulating operation of the DUT by applying said given set of inputs to the target memory via the input ports of the target memory in said defined cycle of time, and to maintain a cycle accurate memory for the FPGA, wherein in said defined cycle of time, the target memory has more target clock cycles than the device memory has device clock cycles, and at an end of said defined cycle of time, each of the device memory and the target memory has an associated state, including using said more target clock cycles of the target memory for multiplexing the given set of inputs to the target memory in said defined cycle of time; and a control module for initiating and controlling the simulation of the DUT with the FPGA, including applying control signals to the FPGA to create a cycle accurate model of the DUT memory by separating a DUT memory interface protocol from a target memory storage array, wherein at the end of said defined cycle of time, the device memory and the target memory are in the same state to validate the DUT over the defined cycle of time.

25. The system according to claim 24, wherein:

the target memory clocks are free running clocks; and the target memory controller is configured to create a cycle accurate and cycle reproducible model of the DUT memory by operating the target memory on the free running clocks, while the DUT memory interface is operated at the stoppable DUT clocks; and wherein the stoppable DUT clocks and the free running clocks have a constant frequency and phase relationship.

26. The system according to claim 24, wherein:

the DUT memory is a DUT DRAM memory and the target memory is a target DRAM memory; and the target memory controller hides a refresh of the target DRAM memory by scrambling the addresses of the target DRAM memory to reduce the necessity for refreshing the target DRAM memory, and forcing a refresh in the target DRAM memory when a refresh of the DUT DRAM memory occurs, and the system further comprises a mechanism to stop the DUT clocks while the refresh of the target memory is occurring, and to restart the DUT clocks after the refresh of the target memory has finished.

\* \* \* \* \*